(12) United States Patent
Lai et al.

(10) Patent No.: US 6,635,946 B2
(45) Date of Patent: Oct. 21, 2003

(54) SEMICONDUCTOR DEVICE WITH TRENCH ISOLATION STRUCTURE

(75) Inventors: Han-Chao Lai, Taichung (TW); Hung-Sui Lin, Tainan (TW); Tao-Cheng Lu, Kaohsiung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/930,304

(22) Filed: Aug. 16, 2001

(65) Prior Publication Data

US 2003/0034543 A1 Feb. 20, 2003

(51) Int. Cl.[7] ............... H01L 29/76; H01L 29/94; H01L 31/062; H01L 31/113; H01L 31/119; H01L 27/01; H01L 27/12; H01L 31/0392; H01L 29/00

(52) U.S. Cl. .................. 257/510; 257/501; 257/506; 257/374; 257/288; 257/336; 257/344; 257/347

(58) Field of Search ................... 257/347, 348, 257/349, 350, 351, 352, 314, 510, 374, 408, 411, 501, 506, 288, 336, 344

(56) References Cited

U.S. PATENT DOCUMENTS

| 4,954,855 | A | * | 9/1990 | Mimura et al. ............. 257/61 |
| 6,162,716 | A | * | 12/2000 | Yu et al. ................. 438/592 |
| 6,274,442 | B1 | * | 8/2001 | Gardner et al. ........... 438/287 |
| 6,274,457 | B1 | * | 8/2001 | Sakai et al. .............. 438/424 |
| 6,323,073 | B1 | * | 11/2001 | Yeh et al. ................ 438/181 |
| 6,555,844 | B1 | * | 4/2003 | Lin et al. ................. 257/66 |

* cited by examiner

*Primary Examiner*—Nathan J. Flynn
*Assistant Examiner*—Victor A. Mandala, Jr.

(57) ABSTRACT

A semiconductor device with trench isolation structure is disclosed. The invention uses a trench isolation structure that can be formed by using conventional methods to prevent problems such as drain induced barrier lowering (DIBL), punch-through leakage and spiking leakage. Thus these poor electrical properties of the conventional semiconductor device with a shallow junction depth resulting from the shrink of design rules can be solved.

20 Claims, 3 Drawing Sheets

SEMICONDUCTOR DEVICE WITH TRENCH ISOLATION STRUCTURE

BACKGROUND OF THE INVENTION

1. Field of the Invention

The present invention relates to a semiconductor device with a trench isolation structure, and more particularly to a MOSFET having a trench isolation structure therein.

2. Description of the Related Art

A significant requirement in sub-micron high-performance semiconductor technologies is junction depth reduction in, for example, MOS (metal-oxide-semiconductor) source and drains and bipolar emitters and bases. Reducing the junction depth suppresses MOS (metal-oxide-semiconductor) transistor punch-through leakage and minimizes short channel effects such as drain-induced barrier lowering (DIBL) in CMOS devices. Devices junctions with relatively high dopant concentrations, ultra-shallow depths, low contact sheet resistances, and low junction leakage currents will be critical for advanced deep submicron technologies.

ULSI integrated Circuits having submicron channel lengths require scaling down of the geometries of devices, including the channel length of metal oxide semiconductor field effect transistors (MOSFETS or MISFET's), which is the ubiquitous workhorse in ULSI circuits. The driving force behind scaling down channel length has been an increase of packing density of devices on a typical chip which has concomitant advantages of increased functionality as well as higher throughput for the process. However, the reduction of channel lengths has resulted in severe technological problems in terms of device performance and reliability.

The internal electric fields near the drain end of small geometry MOSFET's are very high, resulting in carrier heating effects and hot electron degradation of devices. To reduce the electric fields, conventionally a lightly doped drain (LDD) is used in MOSFET's where the doping level in the drain adjacent to the channel is reduced so that the electric field near the drain-channel junction can be lowered. However, the LDD approach has severe problems for deep submicron channel lengths since there is an unacceptable real estate penalty for the LDD regions. Further, the fields cannot be reduced sufficiently and the trapped hot electrons in the gate oxide can have serious depletion effects in the LDD region. Source/drain junction depths, especially the LDD junction depths, have to be made very shallow to avoid charge sharing effects such as threshold voltage, $V_T$, lowering with reduction of the channel length, punch-through and drain induced barrier lowering. Additionally, there are source/drain series resistance problems associated with the shallow LDD region, and to a lesser degree with the shallow LDD regions. Also, there can be enhanced leakage in the LDD region due to band-to-band tunneling or gate induced drain leakage (GIDL). Further, there is a source/drain and gate overlap Miller capacitance and a large source/drain junction capacitance because of the high tank doping required for punch-through protection. All of these factors pose severe technological challenges in fabricating the devices, slow down circuit switching speeds, and increase active power dissipation.

In view of the drawbacks mentioned above, there is a continued need to develop new semiconductor device that overcome the disadvantages associated with prior art.

SUMMARY OF THE INVENTION

It is therefore an object of the invention to provide a semiconductor device with a trench isolation structure that can prevent drain induced barrier lowering (DIBL), punch-through leakage and spiking leakage without degrading the performance and the reliability of the semiconductor device.

It is another object of this invention to provide a semiconductor device with a trench isolation structure that can solve the poor electrical property of the conventional semiconductor device with a shallow junction depth and a short channel resulting from the shrink of design rules.

It is a further object of this invention to provide a new structure of semiconductor devices without the problems resulting from the shrink of design rules.

To achieve these objects, and in accordance with the purpose of the invention, the invention provides a semiconductor device with a trench isolation structure, said semiconductor device comprising: a substrate having a trench isolation, a source and a drain region therein, wherein said trench isolation isolates and is between said source and said drain region; a crystalline silicon layer over said substrate; a gate oxide layer on said crystalline silicon layer and above said trench isolation; and a gate electrode on said gate oxide layer.

The invention also provides a semiconductor device with a trench isolation structure, said semiconductor device comprising: a substrate having a trench isolation structure, a source region and a drain region therein, wherein said trench isolation structure isolates and is between said source and said drain region; a crystalline silicon layer over said substrate having a lightly doped drain region therein; a gate oxide layer on said crystalline silicon layer and directly above said trench isolation structure; and a gate electrode on said gate oxide layer, wherein said gate electrode has a spacer adjacent the sidewalls of said gate electrode.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
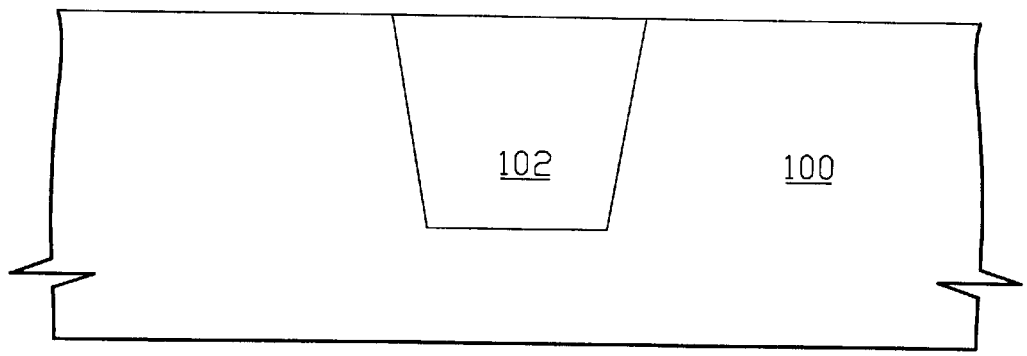
FIG. 1A shows a cross-sectional diagram of a substrate having a trench isolation structure therein.

Referring to FIG. 1A, a substrate 100 having a trench isolation structure 102 therein is shown. The substrate 100 preferably comprises, but is not limited to: a silicon substrate with a <100> crystallographic orientation. The substrate can also comprise other semiconductor substrate such as a silicon-on-insulator (SOI) substrate. The substrate 100 can have N well or P well therein. The trench isolation structure 102 can be formed by conventional methods such as the following process steps. Firstly, a trench is formed into the substrate 100 by using conventional photolithography and etching methods that can be used to form conventional shallow trench isolations. The depth of the trench is from about 800 angstrom to about 2000 angstrom. Then a dielectric layer is formed over the substrate 100 to fill the trench by conventional deposition methods such as chemical vapor deposition processes. Next the dielectric layer is planarized by conventional methods such as chemical mechanical polishing methods to expose the substrate 100. The dielectric layer comprises, but is not limited to: a silicon dioxide layer. Other dielectric material such as silicon nitride should not be excluded.

Figure 1B:
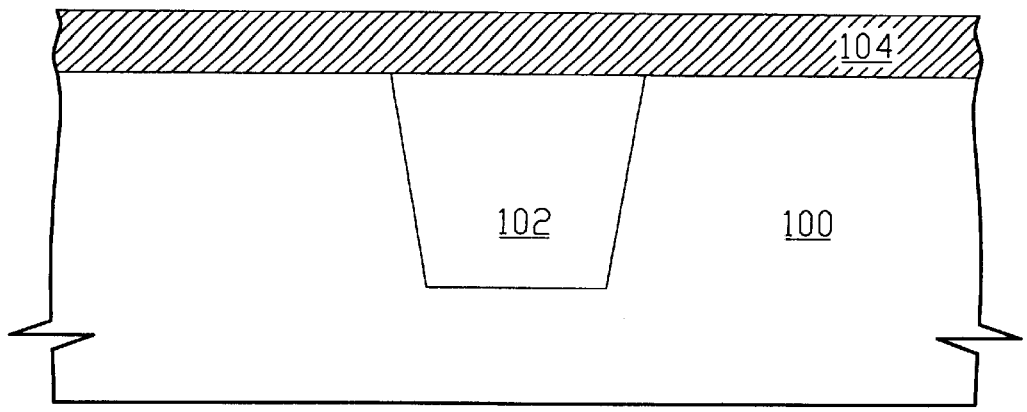
FIG. 1B shows a result of forming a crystalline silicon layer over the substrate shown in FIG. 1A.

Referring to FIG. 1B, a crystalline silicon layer 104 is formed over the substrate 100. The crystalline silicon layer 104 comprises, but is not limited to: an in-situ doped epitaxial silicon layer formed by conventional deposition methods. The thickness of the crystalline silicon layer 104 is from about 100 angstrom to about 500 angstrom, and is preferably about 250 angstrom.

Figure 1C:
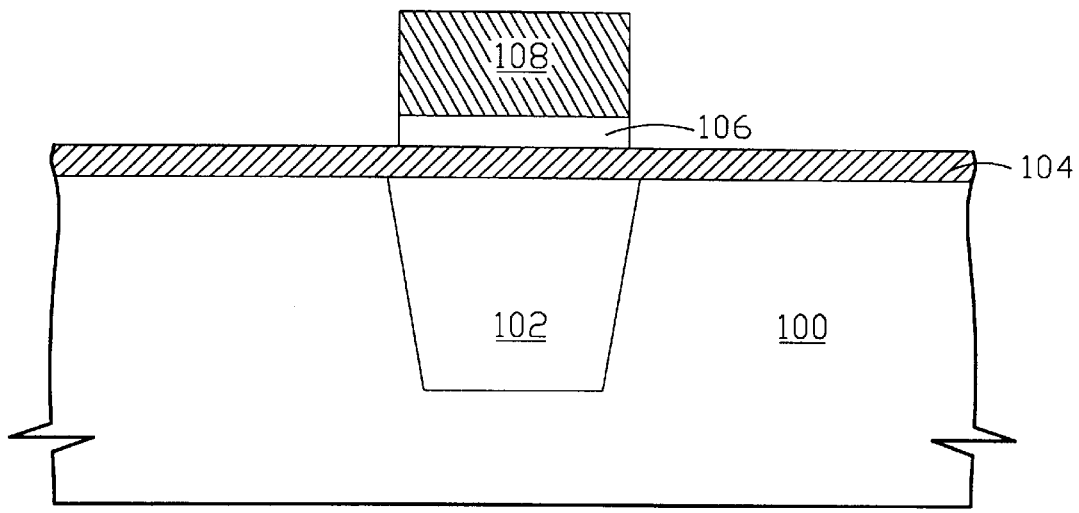
FIG. 1C shows a result of sequentially forming a gate oxide layer and a gate electrode on the crystalline silicon layer shown in FIG. 1B.

Referring to FIG. 1C, a gate oxide layer 106 and a gate electrode 108 are sequentially formed on the crystalline silicon layer 104. The gate oxide layer 106 can be formed by using conventional methods such as dry oxidation methods to oxidize a portion of the crystalline silicon layer 104 and form an oxide layer. The gate electrode 108 comprises, but is not limited to: a polysilicon gate electrode. The gate electrode 108 can be formed by the following process steps. First of all, a conductive layer is formed over the oxide layer by conventional chemical or physical vapor depositions. Then a gate electrode pattern is formed by conventional photolithography methods. Next the conductive layer is etched by conventional etching methods to expose the oxide layer and form the gate electrode 108. The oxide layer then is etched by conventional etching methods to expose the remaining crystalline silicon layer 104.

Figure 1D:
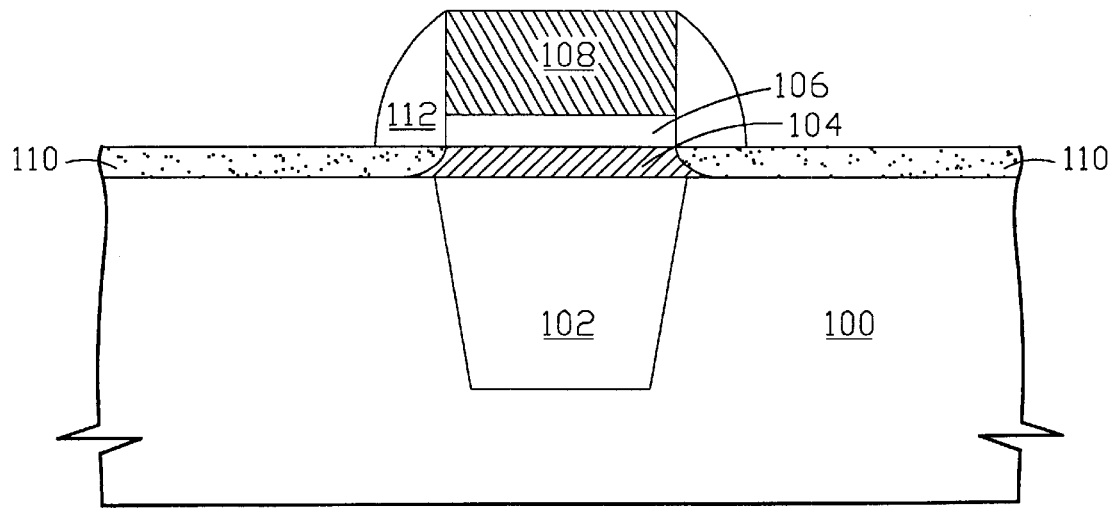
FIG. 1D shows a result of forming a LDD region in the crystalline silicon layer and a spacer adjacent the sidewall of the gate electrode.

Referring to FIG. 1D, a lightly doped drain (LDD) region 110 is formed in the crystalline silicon layer 104 by using conventional ion implantation processes and a spacer 112 is formed adjacent the sidewall of the gate electrode 108. The spacer 112 can be formed by forming a dielectric layer such as a silicon dioxide layer or a silicon nitride layer over the substrate 100 by conventional chemical vapor deposition processes and anisotropically etching the dielectric layer. The LDD region 110 as well as the spacer 112 can also be omitted if they are not necessary.

Figure 1E:
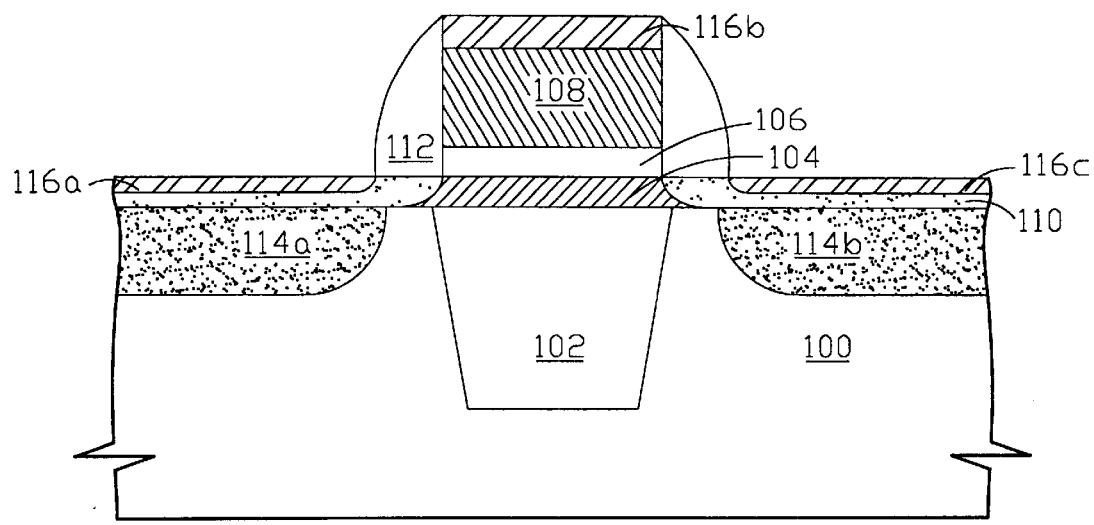
FIG. 1E shows a result of forming source and drain regions in the substrate and salicide layers on the crystalline silicon layer and the gate electrode.

Referring to FIG. 1E, source and drain regions 114a and 114b are formed in the substrate 100 by conventional ion implantation processes and salicide layers 116a, 116b and 116c are formed on the LDD region 110 and the gate electrode 108 by using conventional methods. The dopants used to form the source and drain regions 114a and 114b can be N type such as phosphorus and arsenic or P type such as boron and $BF_2$. The salicide layers 116a, 116b and 116c can be $WSi_2$, $TiSi_2$ and $MoSi_2$ formed by conventional processes. The salicide layers 116a, 116b and 116c such as $TiSi_2$ layers, can be formed by forming a Ti layer over the substrate 100 by a conventional physical vapor deposition process, heating the substrate 100 to form the $TiSi_2$ layers by a rapid thermal processing method and removing the remaining Ti layer by conventional etching processes.

If the substrate 100 is a P− type substrate, for example, and the dopants are N type, the semiconductor device set forth is an NMOS transistor. If the dopants are P type, then the semiconductor device is a PMOS transistor and the trench isolation structure 102 is formed in an N well. The invention can also apply to various CMOS transistors such as N well CMOS transistors, P well CMOS transistors, twin well CMOS transistors and BiCMOS transistors.

As the junction depth and the channel length are further reduced, the problems of drain induced barrier lowering (DIBL), punch-through leakage and spiking leakage will be more crucial. The invention uses a trench isolation that can be formed by using conventional methods to prevent the problems mentioned above. Thus the poor electrical property of the conventional semiconductor device with a shallow junction depth and a short channel resulting from the shrink of design rules can be solved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A semiconductor device with a trench isolation structure, said semiconductor device comprising:
    a substrate having a trench isolation structure, a source region and a drain region therein, wherein said trench isolation structure isolates and is between said source and said drain region;
    a crystalline silicon layer on said trench isolation structure, said source and said drain region;
    a gate oxide layer on a portion of said crystalline silicon layer which is on said trench isolation structure; and
    a gate electrode directly on said gate oxide layer.

2. The semiconductor device according to claim 1, wherein the depth of said trench isolation structure is from about 800 angstrom to about 2000 angstrom.

3. The semiconductor device according to claim 1, wherein said source region and said drain region are an N type source region and an N type drain region.

4. The semiconductor device according to claim 1, wherein said source region and said drain region are a P type source region and a P type drain region.

5. The semiconductor device according to claim 1, wherein said crystalline silicon layer comprises an in situ doped epitaxial silicon layer.

6. The semiconductor device according to claim 1, wherein the thickness of said crystalline silicon layer is from about 100 angstrom to about 500 angstrom.

7. The semiconductor device according to claim 1, wherein the thickness of said crystalline silicon layer is preferably about 250 angstrom.

8. The semiconductor device according to claim 1, wherein said crystalline silicon layer has a lightly doped drain region therein.

9. A semiconductor device with a trench isolation structure, said semiconductor device comprising:
- a substrate having a trench isolation structure, a source region and a drain region therein, wherein said trench isolation structure isolates and is between said source and said drain region;
- a crystalline silicon layer on said trench isolation structure, said source and said drain region having a lightly doped drain region therein;
- a gate oxide layer on a portion of said crystalline silicon layer which is on said trench isolation structure; and
- a gate electrode directly on said gate oxide layer, wherein said gate electrode has a spacer adjacent the sidewall of said gate electrode.

10. The semiconductor device according to claim 9, wherein the depth of said trench isolation structure is from about 800 angstrom to about 2000 angstrom.

11. The semiconductor device according to claim 9, wherein said crystalline silicon layer comprises an in situ doped epitaxial silicon layer.

12. The semiconductor device according to claim 9, wherein the thickness of said crystalline silicon layer is from about 100 angstrom to about 500 angstrom.

13. The semiconductor device according to claim 9, wherein the thickness of said crystalline silicon layer is preferably about 250 angstrom.

14. A semiconductor device with a trench isolation structure, said semiconductor device comprising:
- a substrate having a trench isolation, a source region and a drain region therein, wherein said trench isolation structure isolates and is between said source and said drain region;
- an in situ doped epitaxial silicon layer on said trench isolation structure, said source and said drain region;
- a gate oxide layer on a portion of said in situ doped epitaxial silicon layer which is on said trench isolation structure; and
- a gate electrode directly on said gate oxide layer, wherein said gate electrode has a spacer adjacent the sidewall of said gate electrode.

15. The semiconductor device according to claim 14, wherein the depth of said trench isolation structure is from about 800 angstrom to about 2000 angstrom.

16. The semiconductor device according to claim 14, wherein said source and said drain region are an N type source region and an N type drain region.

17. The semiconductor device according to claim 14, wherein said source region and said drain region are a P type source region and a P type drain region.

18. The semiconductor device according to claim 14, wherein the thickness of said in situ doped epitaxial silicon layer is from about 100 angstrom to about 500 angstrom.

19. The semiconductor device according to claim 14, wherein the thickness of said in situ doped epitaxial silicon layer is preferably about 250 angstrom.

20. The semiconductor device according to claim 14, wherein said in situ doped epitaxial silicon layer has a lightly doped drain region therein.

* * * * *